US009343490B2

(12) United States Patent　　(10) Patent No.: US 9,343,490 B2
Yu et al.　　(45) Date of Patent: May 17, 2016

(54) NANOWIRE STRUCTURED COLOR FILTER ARRAYS AND FABRICATION METHOD OF THE SAME

(71) Applicant: Zena Technologies, Inc., Cambridge, MA (US)

(72) Inventors: Young-June Yu, Cranbury, NJ (US); Munib Wober, Topsfield, MA (US)

(73) Assignee: ZENA TECHNOLOGIES, INC., Cambridge, MA (US)

( * ) Notice: Subject to any disclaimer, the term of this patent is extended or adjusted under 35 U.S.C. 154(b) by 0 days.

(21) Appl. No.: 13/963,847

(22) Filed: Aug. 9, 2013

(65) Prior Publication Data

US 2015/0041937 A1　　Feb. 12, 2015

(51) Int. Cl.
　　*H01L 27/14*　　(2006.01)
　　*H01L 27/146*　　(2006.01)
　　*B82Y 20/00*　　(2011.01)

(52) U.S. Cl.
　　CPC ...... *H01L 27/14625* (2013.01); *H01L 27/1464* (2013.01); *H01L 27/14621* (2013.01); *H01L 27/14627* (2013.01); *H01L 27/14685* (2013.01); *B82Y 20/00* (2013.01)

(58) Field of Classification Search
　　CPC ................... H01L 27/14625; H01L 27/14685
　　See application file for complete search history.

(56) References Cited

U.S. PATENT DOCUMENTS 1,918,848 A　　7/1933　Land
3,903,427 A　　9/1975　Pack
4,017,332 A　　4/1977　James
4,292,512 A　　9/1981　Miller
4,316,048 A　　2/1982　Woodall
4,357,415 A　　11/1982　Hartman (Continued)

FOREIGN PATENT DOCUMENTS

CN　　1624925　　6/2005
CN　　1306619　　3/2007

(Continued)

OTHER PUBLICATIONS

Office Action issued on Jan. 28, 2014 in Taiwanese Application No. 100146327.

(Continued)

*Primary Examiner* — Daniel Whalen
(74) *Attorney, Agent, or Firm* — Pillsbury Winthrop Shaw Pittman LLP

(57) ABSTRACT

Color filter array devices and methods of making color filter array devices are disclosed herein. A color filter array may include a substrate having a plurality of pixels thereon, one or more nanowires associated with each of the plurality of pixels, wherein each of the one or more nanowires extends substantially perpendicularly from the substrate, and an optical coupler associated with each of the one or more nanowires. A method of making a color filter array may include, making an array of nanowires, wherein each of the nanowires extend substantially perpendicularly from a substrate, disposing a transparent polymer material to substantially encapsulate the nanowires, removing the nanowires from the substrate, providing a pixel array comprising a plurality of pixels, wherein a hard polymer substantially covers an image plane of the pixel array, disposing the array of nanowires on the pixel array, and removing the transparent polymer encapsulating the nanowires.

14 Claims, 5 Drawing Sheets

(56) References Cited

U.S. PATENT DOCUMENTS

| | | |
|---|---|---|
| 4,387,265 A | 6/1983 | Dalal |
| 4,394,571 A | 7/1983 | Jurisson |
| 4,400,221 A | 8/1983 | Rahilly |
| 4,443,890 A | 4/1984 | Eumurian |
| 4,513,168 A | 4/1985 | Borden |
| 4,531,055 A | 7/1985 | Shepherd, Jr. |
| 4,620,237 A | 10/1986 | Traino |
| 4,678,772 A | 7/1987 | Segal et al. |
| 4,827,335 A | 5/1989 | Saito |
| 4,846,556 A | 7/1989 | Haneda |
| 4,857,973 A | 8/1989 | Yang |
| 4,876,586 A | 10/1989 | Dyck |
| 4,880,613 A | 11/1989 | Satoh |
| 4,896,941 A | 1/1990 | Hayashi |
| 4,950,625 A | 8/1990 | Nakashima |
| 4,971,928 A | 11/1990 | Fuller |
| 4,972,244 A | 11/1990 | Buffet |
| 4,990,988 A | 2/1991 | Lin |
| 5,071,490 A | 12/1991 | Yokota |
| 5,081,049 A | 1/1992 | Green |
| 5,096,520 A | 3/1992 | Faris |
| 5,124,543 A | 6/1992 | Kawashima |
| 5,217,911 A | 6/1993 | Denda |
| 5,247,349 A | 9/1993 | Olego |
| 5,272,518 A | 12/1993 | Vincent |
| 5,311,047 A | 5/1994 | Chang |
| 5,347,147 A | 9/1994 | Jones |
| 5,362,972 A | 11/1994 | Yazawa |
| 5,374,841 A | 12/1994 | Goodwin |
| 5,391,896 A | 2/1995 | Wanlass |
| 5,401,968 A | 3/1995 | Cox |
| 5,449,626 A | 9/1995 | Hezel |
| 5,468,652 A | 11/1995 | Gee |
| 5,602,661 A | 2/1997 | Schadt |
| 5,612,780 A | 3/1997 | Rickenbach |
| 5,671,914 A | 9/1997 | Kalkhoran |
| 5,696,863 A | 12/1997 | Kleinerman |
| 5,723,945 A | 3/1998 | Schermerhorn |
| 5,747,796 A | 5/1998 | Heard |
| 5,767,507 A | 6/1998 | Unlu |
| 5,798,535 A | 8/1998 | Huang |
| 5,844,290 A | 12/1998 | Furumiya |
| 5,853,446 A | 12/1998 | Carre |
| 5,857,053 A | 1/1999 | Kane |
| 5,877,492 A | 3/1999 | Fujieda |
| 5,880,495 A | 3/1999 | Chen |
| 5,885,881 A | 3/1999 | Ojha |
| 5,900,623 A | 5/1999 | Tsang |
| 5,943,463 A | 8/1999 | Unuma |
| 5,968,528 A | 10/1999 | Deckner |
| 6,013,871 A | 1/2000 | Curtin |
| 6,033,582 A | 3/2000 | Lee |
| 6,037,243 A | 3/2000 | Ha |
| 6,046,466 A | 4/2000 | Ishida |
| 6,074,892 A | 6/2000 | Bowers |
| 6,100,551 A | 8/2000 | Lee |
| 6,270,548 B1 | 8/2001 | Campbell |
| 6,301,420 B1 | 10/2001 | Greenaway |
| 6,326,649 B1 | 12/2001 | Chang |
| 6,388,243 B1 | 5/2002 | Berezin |
| 6,388,648 B1 | 5/2002 | Clifton |
| 6,407,439 B1 | 6/2002 | Hier |
| 6,459,034 B2 | 10/2002 | Muramoto |
| 6,463,204 B1 | 10/2002 | Ati |
| 6,542,231 B1 | 4/2003 | Garrett |
| 6,563,995 B2 | 5/2003 | Keaton |
| 6,566,723 B1 | 5/2003 | Vook |
| 6,680,216 B2 | 1/2004 | Kwasnick |
| 6,709,929 B2 | 3/2004 | Zhang |
| 6,720,594 B2 | 4/2004 | Rahn |
| 6,771,314 B1 | 8/2004 | Bawolek |
| 6,805,139 B1 | 10/2004 | Savas |
| 6,812,473 B1 | 11/2004 | Amemiya |
| 6,904,187 B2 | 6/2005 | Fischer et al. |
| 6,927,145 B1 | 8/2005 | Yang |
| 6,960,526 B1 | 11/2005 | Shah |
| 6,967,120 B2 | 11/2005 | Jang |
| 6,969,899 B2 | 11/2005 | Yaung |
| 6,987,258 B2 | 1/2006 | Mates |
| 6,996,147 B2 | 2/2006 | Majumdar |
| 7,052,927 B1 | 5/2006 | Fletcher |
| 7,064,372 B2 | 6/2006 | Duan |
| 7,105,428 B2 | 9/2006 | Pan |
| 7,106,938 B2 | 9/2006 | Baek et al. |
| 7,109,517 B2 | 9/2006 | Zaidi |
| 7,153,720 B2 | 12/2006 | Augusto |
| 7,163,659 B2 | 1/2007 | Stasiak |
| 7,192,533 B2 | 3/2007 | Bakkers |
| 7,208,783 B2 | 4/2007 | Palsule |
| 7,230,286 B2 | 6/2007 | Cohen |
| 7,235,475 B2 | 6/2007 | Kamins |
| 7,241,434 B2 | 7/2007 | Anthony |
| 7,253,017 B1 | 8/2007 | Roscheisen |
| 7,254,151 B2 | 8/2007 | Lieber |
| 7,262,400 B2 | 8/2007 | Yaung |
| 7,265,328 B2 | 9/2007 | Mouli |
| 7,272,287 B2 | 9/2007 | Bise |
| 7,285,812 B2 | 10/2007 | Tang |
| 7,306,963 B2 | 12/2007 | Linden |
| 7,307,327 B2 | 12/2007 | Bahl |
| 7,311,889 B2 | 12/2007 | Awano |
| 7,326,915 B2 | 2/2008 | Kaluzhny |
| 7,330,404 B2 | 2/2008 | Peng |
| 7,335,962 B2 | 2/2008 | Mouli |
| 7,336,860 B2 | 2/2008 | Cyr |
| 7,339,110 B1 | 3/2008 | Mulligan et al. |
| 7,358,583 B2 | 4/2008 | Reznik |
| 7,381,966 B2 | 6/2008 | Starikov |
| 7,388,147 B2 | 6/2008 | Mulligan |
| 7,416,911 B2 | 8/2008 | Heath et al. |
| 7,446,025 B2 | 11/2008 | Cohen |
| 7,462,774 B2 | 12/2008 | Roscheisen |
| 7,471,428 B2 | 12/2008 | Ohara |
| 7,491,269 B2 | 2/2009 | Legagneux |
| 7,507,293 B2 | 3/2009 | Li |
| 7,521,322 B2 | 4/2009 | Tang |
| 7,524,694 B2 | 4/2009 | Adkisson |
| 7,582,857 B2 | 9/2009 | Gruev et al. |
| 7,598,482 B1 | 10/2009 | Verhulst |
| 7,622,367 B1 | 11/2009 | Nuzzo |
| 7,626,685 B2 | 12/2009 | Jin |
| 7,646,138 B2 | 1/2010 | Williams |
| 7,646,943 B1 | 1/2010 | Wober |
| 7,647,695 B2 | 1/2010 | MacNutt |
| 7,649,665 B2 | 1/2010 | Kempa |
| 7,655,860 B2 | 2/2010 | Parsons |
| 7,663,202 B2 | 2/2010 | Wang |
| 7,692,860 B2 | 4/2010 | Sato |
| 7,704,806 B2 | 4/2010 | Chae |
| 7,713,779 B2 | 5/2010 | Firon |
| 7,719,678 B2 | 5/2010 | Kamins |
| 7,719,688 B2 | 5/2010 | Kamins |
| 7,732,769 B2 | 6/2010 | Snider |
| 7,732,839 B2 | 6/2010 | Sebe |
| 7,736,954 B2 | 6/2010 | Hussain |
| 7,740,824 B2 | 6/2010 | Godfried |
| 7,790,495 B2 | 9/2010 | Assefa |
| 7,888,155 B2 | 2/2011 | Chen |
| 7,902,540 B2 | 3/2011 | Cohen |
| 7,948,555 B2 | 5/2011 | Kwon et al. |
| 8,030,729 B2 | 10/2011 | Quitoriano |
| 8,035,184 B1 | 10/2011 | Dutta |
| 8,049,203 B2 | 11/2011 | Samuelson |
| 8,063,450 B2 | 11/2011 | Wernersson |
| 8,067,299 B2 | 11/2011 | Samuelson |
| 8,067,736 B2 | 11/2011 | Gruss |
| 8,084,728 B2 | 12/2011 | Tsang |
| 8,093,675 B2 | 1/2012 | Tsunemi |
| 8,118,170 B2 | 2/2012 | Sato |
| 8,143,658 B2 | 3/2012 | Samuelson |
| 8,154,127 B1 | 4/2012 | Kamins |
| 8,193,524 B2 | 6/2012 | Bjoerk |
| 8,208,776 B2 | 6/2012 | Tokushima |
| 8,212,138 B2 | 7/2012 | Landis |

(56) References Cited

U.S. PATENT DOCUMENTS

| | | |
|---|---|---|
| 8,222,705 B2 | 7/2012 | Ogino |
| 8,242,353 B2 | 8/2012 | Karg |
| 8,269,985 B2 | 9/2012 | Wober |
| 8,274,039 B2 | 9/2012 | Wober |
| 8,299,472 B2 | 10/2012 | Yu et al. |
| 8,330,090 B2 | 12/2012 | Agarwal |
| 8,384,007 B2 | 2/2013 | Yu et al. |
| 8,455,857 B2 | 6/2013 | Samuelson |
| 8,471,190 B2 | 6/2013 | Wober |
| 8,514,411 B2 | 8/2013 | Wober |
| 8,546,742 B2 | 10/2013 | Wober |
| 8,748,799 B2 | 6/2014 | Wober |
| 8,766,272 B2 | 7/2014 | Yu et al. |
| 8,791,470 B2 | 7/2014 | Wober |
| 8,810,808 B2 | 8/2014 | Wober |
| 8,835,831 B2 | 9/2014 | Yu et al. |
| 8,866,065 B2 | 10/2014 | Wober |
| 9,000,353 B2 | 4/2015 | Seo |
| 2002/0003201 A1 | 1/2002 | Yu |
| 2002/0020846 A1 | 2/2002 | Pi |
| 2002/0021879 A1 | 2/2002 | Lee |
| 2002/0071468 A1 | 6/2002 | Sandstrom |
| 2002/0104821 A1 | 8/2002 | Bazylenko |
| 2002/0109082 A1 | 8/2002 | Nakayama |
| 2002/0117675 A1 | 8/2002 | Mascarenhas |
| 2002/0130311 A1 | 9/2002 | Lieber |
| 2002/0172820 A1 | 11/2002 | Majumdar |
| 2003/0003300 A1 | 1/2003 | Korgel |
| 2003/0006363 A1 | 1/2003 | Campbell |
| 2003/0077907 A1 | 4/2003 | Kao |
| 2003/0089899 A1 | 5/2003 | Lieber |
| 2003/0103744 A1 | 6/2003 | Koyama |
| 2003/0132480 A1 | 7/2003 | Chau |
| 2003/0160176 A1 | 8/2003 | Vispute |
| 2003/0189202 A1 | 10/2003 | Li |
| 2003/0227090 A1 | 12/2003 | Okabe |
| 2004/0011975 A1 | 1/2004 | Nicoli |
| 2004/0021062 A1 | 2/2004 | Zaidi |
| 2004/0026684 A1 | 2/2004 | Empedocles |
| 2004/0058058 A1 | 3/2004 | Shchegolikhin |
| 2004/0065362 A1 | 4/2004 | Watabe |
| 2004/0075464 A1 | 4/2004 | Samuelson |
| 2004/0095658 A1 | 5/2004 | Buretea |
| 2004/0109666 A1 | 6/2004 | Kim |
| 2004/0114847 A1 | 6/2004 | Fischer et al. |
| 2004/0118337 A1 | 6/2004 | Mizutani |
| 2004/0118377 A1 | 6/2004 | Bloms |
| 2004/0122328 A1 | 6/2004 | Wang |
| 2004/0124366 A1 | 7/2004 | Zeng |
| 2004/0155247 A1 | 8/2004 | Benthien |
| 2004/0156610 A1 | 8/2004 | Charlton et al. |
| 2004/0160522 A1 | 8/2004 | Fossum |
| 2004/0180461 A1 | 9/2004 | Yaung |
| 2004/0213307 A1 | 10/2004 | Lieber |
| 2004/0217086 A1 | 11/2004 | Kawashima |
| 2004/0223681 A1 | 11/2004 | Block |
| 2004/0241965 A1 | 12/2004 | Merritt |
| 2004/0252957 A1 | 12/2004 | Schmidt et al. |
| 2004/0261840 A1 | 12/2004 | Schmit |
| 2005/0009224 A1 | 1/2005 | Yang |
| 2005/0035381 A1 | 2/2005 | Holm |
| 2005/0082676 A1 | 4/2005 | Andry |
| 2005/0087601 A1 | 4/2005 | Gerst, III |
| 2005/0095699 A1 | 5/2005 | Miyauchi |
| 2005/0109388 A1 | 5/2005 | Murakami |
| 2005/0116271 A1 | 6/2005 | Kato |
| 2005/0133476 A1 | 6/2005 | Islam |
| 2005/0161662 A1 | 7/2005 | Majumdar et al. |
| 2005/0164514 A1 | 7/2005 | Rauf |
| 2005/0190453 A1 | 9/2005 | Dobashi |
| 2005/0201704 A1 | 9/2005 | Ellwood |
| 2005/0218468 A1 | 10/2005 | Owen |
| 2005/0224707 A1 | 10/2005 | Guedj |
| 2005/0242409 A1 | 11/2005 | Yang |
| 2005/0284517 A1 | 12/2005 | Shinohara |
| 2006/0011362 A1 | 1/2006 | Tao |
| 2006/0027071 A1 | 2/2006 | Barnett |
| 2006/0038990 A1 | 2/2006 | Habib et al. |
| 2006/0113622 A1 | 6/2006 | Adkisson |
| 2006/0115230 A1 | 6/2006 | Komoguchi et al. |
| 2006/0121371 A1 | 6/2006 | Wu |
| 2006/0146323 A1 | 7/2006 | Bratkovski |
| 2006/0162766 A1 | 7/2006 | Gee |
| 2006/0180197 A1 | 8/2006 | Gui |
| 2006/0208320 A1 | 9/2006 | Tsuchiya et al. |
| 2006/0257071 A1 | 11/2006 | Bise |
| 2006/0260674 A1 | 11/2006 | Tran |
| 2006/0273262 A1 | 12/2006 | Sayag |
| 2006/0273389 A1 | 12/2006 | Cohen |
| 2006/0284118 A1 | 12/2006 | Asmussen |
| 2007/0012980 A1 | 1/2007 | Duan et al. |
| 2007/0012985 A1 | 1/2007 | Stumbo |
| 2007/0023799 A1 | 2/2007 | Boettiger |
| 2007/0025504 A1 | 2/2007 | Tumer |
| 2007/0029545 A1 | 2/2007 | Striakhilev |
| 2007/0052050 A1 | 3/2007 | Dierickx |
| 2007/0076481 A1 | 4/2007 | Tennant |
| 2007/0082255 A1 | 4/2007 | Sun |
| 2007/0099292 A1 | 5/2007 | Miller |
| 2007/0104441 A1 | 5/2007 | Ahn |
| 2007/0107773 A1 | 5/2007 | Fork |
| 2007/0108371 A1 | 5/2007 | Stevens |
| 2007/0114622 A1 | 5/2007 | Adkisson |
| 2007/0120254 A1 | 5/2007 | Hurkx |
| 2007/0126037 A1 | 6/2007 | Ikeda |
| 2007/0137697 A1 | 6/2007 | Kempa |
| 2007/0138376 A1 | 6/2007 | Naughton |
| 2007/0138380 A1 | 6/2007 | Adkisson |
| 2007/0138459 A1 | 6/2007 | Wong |
| 2007/0139740 A1 | 6/2007 | Igura |
| 2007/0140638 A1 | 6/2007 | Yang |
| 2007/0145512 A1 | 6/2007 | Rhodes |
| 2007/0148599 A1 | 6/2007 | True |
| 2007/0152248 A1 | 7/2007 | Choi |
| 2007/0155025 A1 | 7/2007 | Zhang |
| 2007/0164270 A1 | 7/2007 | Majumdar |
| 2007/0170418 A1 | 7/2007 | Bowers |
| 2007/0172623 A1 | 7/2007 | Kresse |
| 2007/0187787 A1 | 8/2007 | Ackerson |
| 2007/0196239 A1 | 8/2007 | Vink |
| 2007/0200054 A1 | 8/2007 | Reznik |
| 2007/0205483 A1 | 9/2007 | Williams |
| 2007/0217754 A1 | 9/2007 | Sasaki |
| 2007/0228421 A1 | 10/2007 | Shioya |
| 2007/0238265 A1 | 10/2007 | Kurashina |
| 2007/0238285 A1 | 10/2007 | Borden |
| 2007/0241260 A1 | 10/2007 | Jaeger |
| 2007/0246689 A1 | 10/2007 | Ge |
| 2007/0248958 A1 | 10/2007 | Jovanovich |
| 2007/0272828 A1 | 11/2007 | Xu |
| 2007/0278500 A1 | 12/2007 | Lin |
| 2007/0285378 A1 | 12/2007 | Lankhorst |
| 2007/0290193 A1 | 12/2007 | Tucker |
| 2007/0290265 A1 | 12/2007 | Augusto |
| 2008/0001498 A1 | 1/2008 | Muller |
| 2008/0006319 A1 | 1/2008 | Bettge |
| 2008/0029701 A1 | 2/2008 | Onozawa |
| 2008/0036038 A1 | 2/2008 | Hersee |
| 2008/0044984 A1 | 2/2008 | Hsieh |
| 2008/0047601 A1 | 2/2008 | Nag |
| 2008/0047604 A1 | 2/2008 | Korevaar |
| 2008/0055451 A1 | 3/2008 | Kanbe |
| 2008/0073742 A1 | 3/2008 | Adkisson |
| 2008/0079022 A1 | 4/2008 | Yamamoto |
| 2008/0079076 A1 | 4/2008 | Sheen |
| 2008/0083963 A1 | 4/2008 | Hsu |
| 2008/0088014 A1 | 4/2008 | Adkisson |
| 2008/0090401 A1 | 4/2008 | Bratkovski |
| 2008/0092938 A1 | 4/2008 | Majumdar |
| 2008/0096308 A1 | 4/2008 | Santori |
| 2008/0108170 A1 | 5/2008 | Adkisson |
| 2008/0116537 A1 | 5/2008 | Adkisson |
| 2008/0128760 A1 | 6/2008 | Jun |
| 2008/0137188 A1 | 6/2008 | Sato et al. |

(56) References Cited

U.S. PATENT DOCUMENTS

| | | |
|---|---|---|
| 2008/0143906 A1 | 6/2008 | Allemand et al. |
| 2008/0145965 A1 | 6/2008 | Reznik |
| 2008/0149914 A1 | 6/2008 | Samuelson et al. |
| 2008/0149944 A1 | 6/2008 | Samuelson |
| 2008/0157253 A1 | 7/2008 | Starikov |
| 2008/0166883 A1 | 7/2008 | Liu |
| 2008/0169017 A1 | 7/2008 | Korevaar |
| 2008/0169019 A1 | 7/2008 | Korevaar |
| 2008/0173615 A1 | 7/2008 | Kim |
| 2008/0178924 A1 | 7/2008 | Kempa |
| 2008/0188029 A1 | 8/2008 | Rhodes |
| 2008/0191278 A1 | 8/2008 | Maekawa |
| 2008/0191298 A1 | 8/2008 | Lin |
| 2008/0211945 A1 | 9/2008 | Hong |
| 2008/0218740 A1 | 9/2008 | Williams |
| 2008/0224115 A1 | 9/2008 | Bakkers |
| 2008/0225140 A1 | 9/2008 | Raynor |
| 2008/0233280 A1 | 9/2008 | Blanchet |
| 2008/0237568 A1 | 10/2008 | Kobayashi |
| 2008/0246020 A1 | 10/2008 | Kawashima |
| 2008/0246123 A1 | 10/2008 | Kamins |
| 2008/0248304 A1 | 10/2008 | Hanrath |
| 2008/0251780 A1 | 10/2008 | Li |
| 2008/0258747 A1 | 10/2008 | Kluth |
| 2008/0260225 A1 | 10/2008 | Szu |
| 2008/0264478 A1 | 10/2008 | Ahn |
| 2008/0266556 A1 | 10/2008 | Kamins |
| 2008/0266572 A1 | 10/2008 | Kamins |
| 2008/0271783 A1 | 11/2008 | Murakami |
| 2008/0277646 A1 | 11/2008 | Kim et al. |
| 2008/0283728 A1 | 11/2008 | Inoue |
| 2008/0283883 A1 | 11/2008 | Shim |
| 2008/0297281 A1 | 12/2008 | Ayazi |
| 2008/0311693 A1 | 12/2008 | Maxwell |
| 2008/0311712 A1 | 12/2008 | Anwar |
| 2009/0001498 A1 | 1/2009 | Wang |
| 2009/0020150 A1 | 1/2009 | Atwater |
| 2009/0020687 A1 | 1/2009 | Lehmann et al. |
| 2009/0032687 A1 | 2/2009 | Lapstun |
| 2009/0046362 A1 | 2/2009 | Guo |
| 2009/0046749 A1 | 2/2009 | Mizuuchi |
| 2009/0050204 A1 | 2/2009 | Habib |
| 2009/0052029 A1 | 2/2009 | Dai et al. |
| 2009/0057650 A1 | 3/2009 | Lieber |
| 2009/0072145 A1 | 3/2009 | Peczalski et al. |
| 2009/0104160 A1 | 4/2009 | Young |
| 2009/0120498 A1 | 5/2009 | Yamazaki |
| 2009/0121136 A1 | 5/2009 | Gruss et al. |
| 2009/0127442 A1 | 5/2009 | Lee |
| 2009/0146198 A1 | 6/2009 | Joe |
| 2009/0151782 A1 | 6/2009 | Ko |
| 2009/0152664 A1 | 6/2009 | Klem |
| 2009/0153961 A1 | 6/2009 | Murakami et al. |
| 2009/0165844 A1 | 7/2009 | Dutta |
| 2009/0173976 A1 | 7/2009 | Augusto |
| 2009/0179225 A1 | 7/2009 | Fertig et al. |
| 2009/0179289 A1 | 7/2009 | Park |
| 2009/0188552 A1 | 7/2009 | Wang |
| 2009/0189144 A1 | 7/2009 | Quitoriano |
| 2009/0189145 A1 | 7/2009 | Wang |
| 2009/0194160 A1 | 8/2009 | Chin |
| 2009/0199597 A1 | 8/2009 | Danley |
| 2009/0201400 A1 | 8/2009 | Zhang |
| 2009/0206405 A1 | 8/2009 | Doyle |
| 2009/0223558 A1 | 9/2009 | Sun |
| 2009/0224245 A1 | 9/2009 | Umezaki |
| 2009/0224349 A1 | 9/2009 | Gambino |
| 2009/0230039 A1 | 9/2009 | Hoenig et al. |
| 2009/0233445 A1 | 9/2009 | Lee |
| 2009/0242018 A1 | 10/2009 | Ahn |
| 2009/0243016 A1 | 10/2009 | Kawahara |
| 2009/0244514 A1 | 10/2009 | Jin |
| 2009/0260687 A1 | 10/2009 | Park |
| 2009/0261438 A1 | 10/2009 | Choi |
| 2009/0266418 A1 | 10/2009 | Hu et al. |
| 2009/0266974 A1 | 10/2009 | Verhulst |
| 2009/0272423 A1 | 11/2009 | Niira |
| 2009/0278998 A1 | 11/2009 | El-Ghoroury |
| 2009/0289320 A1 | 11/2009 | Cohen |
| 2009/0305454 A1 | 12/2009 | Cohen |
| 2010/0006817 A1 | 1/2010 | Ohlsson |
| 2010/0019252 A1 | 1/2010 | Bratkovski |
| 2010/0019296 A1 | 1/2010 | Cha |
| 2010/0019355 A1 | 1/2010 | Kamins |
| 2010/0025710 A1 | 2/2010 | Yamada |
| 2010/0078055 A1 | 4/2010 | Vidu |
| 2010/0090341 A1 | 4/2010 | Wan |
| 2010/0101633 A1 | 4/2010 | Park |
| 2010/0104494 A1 | 4/2010 | Meng |
| 2010/0110433 A1 | 5/2010 | Nedelcu et al. |
| 2010/0116976 A1 | 5/2010 | Wober |
| 2010/0126573 A1 | 5/2010 | Youtsey |
| 2010/0127153 A1 | 5/2010 | Agarwal |
| 2010/0132779 A1 | 6/2010 | Hong |
| 2010/0133986 A1 | 6/2010 | Kim |
| 2010/0136721 A1 | 6/2010 | Song |
| 2010/0148221 A1 | 6/2010 | Yu |
| 2010/0163714 A1 | 7/2010 | Wober |
| 2010/0163941 A1 | 7/2010 | Jung |
| 2010/0178018 A1 | 7/2010 | Augusto |
| 2010/0186809 A1 | 7/2010 | Samuelson et al. |
| 2010/0187404 A1 | 7/2010 | Klem |
| 2010/0200065 A1 | 8/2010 | Choi |
| 2010/0207103 A1 | 8/2010 | Farrow |
| 2010/0218816 A1 | 9/2010 | Guha |
| 2010/0229939 A1 | 9/2010 | Shen |
| 2010/0230653 A1 | 9/2010 | Chen |
| 2010/0237454 A1 | 9/2010 | Fujisawa |
| 2010/0244108 A1 | 9/2010 | Kohnke |
| 2010/0244169 A1 | 9/2010 | Maeda |
| 2010/0249877 A1 | 9/2010 | Naughton |
| 2010/0258184 A1 | 10/2010 | Laughlin |
| 2010/0276572 A1 | 11/2010 | Iwabuchi |
| 2010/0277607 A1 | 11/2010 | Choi |
| 2010/0282314 A1 | 11/2010 | Coakley |
| 2010/0295019 A1 | 11/2010 | Wang |
| 2010/0302440 A1 | 12/2010 | Wober |
| 2010/0304061 A1 | 12/2010 | Ye |
| 2010/0308214 A1 | 12/2010 | Wober |
| 2010/0313952 A1 | 12/2010 | Coakley |
| 2010/0319763 A1 | 12/2010 | Park |
| 2010/0320444 A1 | 12/2010 | Dutta |
| 2011/0018424 A1 | 1/2011 | Takada |
| 2011/0036396 A1 | 2/2011 | Jayaraman |
| 2011/0037133 A1 | 2/2011 | Su |
| 2011/0049572 A1 | 3/2011 | Jeon et al. |
| 2011/0050042 A1 | 3/2011 | Choi et al. |
| 2011/0057231 A1 | 3/2011 | Jeon et al. |
| 2011/0057234 A1 | 3/2011 | Jeon et al. |
| 2011/0057286 A1 | 3/2011 | Jeon et al. |
| 2011/0080508 A1 | 4/2011 | Katsuno |
| 2011/0084212 A1 | 4/2011 | Clark |
| 2011/0127490 A1 | 6/2011 | Mi |
| 2011/0133060 A1 | 6/2011 | Yu |
| 2011/0133160 A1 | 6/2011 | Yu |
| 2011/0135814 A1 | 6/2011 | Miyauchi |
| 2011/0139176 A1 | 6/2011 | Cheung |
| 2011/0146771 A1 | 6/2011 | Chuang et al. |
| 2011/0147870 A1 | 6/2011 | Ang |
| 2011/0180894 A1 | 7/2011 | Samuelson |
| 2011/0195577 A1 | 8/2011 | Kushibiki |
| 2011/0220191 A1 | 9/2011 | Flood |
| 2011/0226937 A1 | 9/2011 | Yu |
| 2011/0248315 A1 | 10/2011 | Nam |
| 2011/0249219 A1 | 10/2011 | Evans |
| 2011/0249322 A1 | 10/2011 | Wang |
| 2011/0253982 A1 | 10/2011 | Wang |
| 2011/0272014 A1 | 11/2011 | Mathai |
| 2011/0297214 A1 | 12/2011 | Kim |
| 2011/0309237 A1 | 12/2011 | Seo et al. |
| 2011/0309240 A1* | 12/2011 | Yu et al. ............... 250/214.1 |
| 2011/0309331 A1* | 12/2011 | Yu et al. ............... 257/21 |
| 2011/0315988 A1 | 12/2011 | Yu |
| 2011/0316106 A1 | 12/2011 | Kim |

(56) References Cited

U.S. PATENT DOCUMENTS

| | | |
|---|---|---|
| 2012/0006390 A1 | 1/2012 | Huo et al. |
| 2012/0009714 A1 | 1/2012 | Mouli |
| 2012/0014837 A1 | 1/2012 | Fehr et al. |
| 2012/0029328 A1 | 2/2012 | Shimizu |
| 2012/0031454 A1 | 2/2012 | Fogel |
| 2012/0060905 A1 | 3/2012 | Fogel |
| 2012/0075513 A1 | 3/2012 | Chipman et al. |
| 2012/0153124 A1* | 6/2012 | Yu et al. .................... 250/208.1 |
| 2012/0192939 A1 | 8/2012 | Tamboli et al. |
| 2012/0196383 A1 | 8/2012 | Nitkowski et al. |
| 2012/0196401 A1 | 8/2012 | Graham |
| 2012/0240999 A1 | 9/2012 | Yoshida |
| 2012/0258563 A1 | 10/2012 | Ogino |
| 2012/0280345 A1 | 11/2012 | Zhu |
| 2012/0298843 A1 | 11/2012 | Yu |
| 2012/0313078 A1 | 12/2012 | Fukui |
| 2012/0318336 A1 | 12/2012 | Hekmatshoar-Tabari et al. |
| 2012/0322164 A1 | 12/2012 | Lal |
| 2013/0000704 A1 | 1/2013 | Fogel |
| 2013/0020620 A1 | 1/2013 | Wober |
| 2013/0037100 A1 | 2/2013 | Platzer Bjorkman |
| 2013/0112256 A1 | 5/2013 | Yu |
| 2013/0125965 A1 | 5/2013 | Hazeghi et al. |
| 2013/0174904 A1 | 7/2013 | Yamasaki |
| 2013/0220406 A1 | 8/2013 | Day |
| 2013/0341749 A1 | 12/2013 | Yu et al. |
| 2014/0045209 A1 | 2/2014 | Chou |
| 2014/0096816 A1 | 4/2014 | Atwater et al. |
| 2014/0117401 A1 | 5/2014 | Herner |

FOREIGN PATENT DOCUMENTS

| | | |
|---|---|---|
| CN | 100350429 | 11/2007 |
| CN | 101459185 | 6/2009 |
| CN | 100568516 | 12/2009 |
| CN | 101675522 | 3/2010 |
| CN | 101681941 | 3/2010 |
| CN | 103201858 | 7/2013 |
| EP | 0809303 B1 | 9/2006 |
| FR | 2923651 | 5/2009 |
| GB | 2348399 A | 4/2000 |
| JP | 591984-13708 | 1/1984 |
| JP | 359013708 A | 1/1984 |
| JP | 2000324396 | 11/2000 |
| JP | 2002151715 | 5/2002 |
| JP | 2005252210 | 9/2005 |
| JP | 2005328135 | 11/2005 |
| JP | 2007134562 | 5/2007 |
| JP | 2007152548 | 6/2007 |
| JP | 2007184566 | 7/2007 |
| JP | 2007520877 | 7/2007 |
| JP | 2007201091 | 8/2007 |
| JP | 2007317961 | 12/2007 |
| JP | 2008288585 | 11/2008 |
| JP | 2009506546 | 2/2009 |
| JP | 2009236914 | 10/2009 |
| JP | 2012543250 | 4/2013 |
| JP | 2013513253 | 4/2013 |
| JP | 2013513254 | 4/2013 |
| TW | I318418 | 5/2004 |
| TW | I228782 | 3/2005 |
| TW | 200535914 | 11/2005 |
| TW | 200536048 | 11/2005 |
| TW | 200742115 | 4/2007 |
| TW | 200810100 | 2/2008 |
| TW | 200814308 | 3/2008 |
| TW | 200845402 | 11/2008 |
| TW | 200847412 | 12/2008 |
| TW | 200915551 | 4/2009 |
| TW | 200941716 | 10/2009 |
| TW | 201027730 | 7/2010 |
| TW | 201034172 | 9/2010 |
| TW | 201044610 | 12/2010 |
| TW | 201140859 | 11/2011 |
| WO | WO8603347 | 6/1986 |
| WO | WO0002379 | 1/2000 |
| WO | 02069623 | 9/2002 |
| WO | 03107439 A1 | 12/2003 |
| WO | WO2005064337 | 7/2005 |
| WO | 2007000879 | 1/2007 |
| WO | WO2008069565 | 6/2008 |
| WO | 2008079076 | 7/2008 |
| WO | WO2008079076 | 7/2008 |
| WO | WO2008131313 | 10/2008 |
| WO | 2008135905 | 11/2008 |
| WO | 2008135905 A3 | 11/2008 |
| WO | WO2008135905 | 11/2008 |
| WO | WO2008143727 | 11/2008 |
| WO | 2008131313 | 12/2008 |
| WO | 2009099841 | 8/2009 |
| WO | WO2009116018 | 9/2009 |
| WO | WO2009137241 | 11/2009 |
| WO | WO2010019887 | 2/2010 |
| WO | WO2010039631 | 4/2010 |
| WO | 2011074457 | 6/2011 |

OTHER PUBLICATIONS

Office Action issued on Mar. 17, 2014 in Korean Application No. 10-2013-7018243.

U.S. Office Action for U.S. Appl. No. 12/910,664, mailed Feb. 26, 2014.

U.S. Office Action for U.S. Appl. No. 12/966,514, mailed Feb. 25, 2014.

U.S. Office Action for U.S. Appl. No. 14/021,672 mailed May 9, 2014.

U.S. Office Action for U.S. Appl. No. 12/945,492 mailed May 13, 2014.

U.S. Office Action for U.S. Appl. No. 13/556,041 mailed Jun. 12, 2014.

U.S. Office Action for U.S. Appl. No. 13/106,851 mailed May 29, 2014.

U.S. Office Action for U.S. Appl. No. 12/982,269 mailed Jun. 11, 2014.

Office Action issued on Jun. 19, 2014 in Taiwanese Application No. 099133891.

Adler, Nanowire Lawns Make for Sheets of Image Sensors, NewScientist.com, Jul. 28, 2008.

Babinec et al., High-Flux, Low-Power Diamond Nanowire Single-Photon Source Arrays: An Enabling Material for Optical and Quantum Computing and Cryptography, obtained on Jul. 22, 2010 at URL: http://otd.harvard.edu/technologies/tech.php?case=3702.

Baillie et al., 'Zero-space microlenses for CMOS image sensors: optical modeling and lithographic process development', Publication Date May 2004, http://adsabs.harvard.edu/abs/2004SPIE.5377.953B, pp. 1-2.

Baomin, et al., Nanotechology 23 (2012) 194003, 7 pages.

Barclay et al., Chip-Based Microcavities Coupled to NV Centers in Single Crystal Diamond, Applied Physics Letters, Nov. 12, 2009, vol. 95, Issue 19.

Brouri et al., Photon Antibunching in the Flurescence of Individual Colored Centers in Diamond, Optics Letters, Sep. 1, 2000, vol. 25, Issue 17.

Catrysse, et al., An Integrated Color Pixel in 0.18 µm CMOS Technology, Proceedings IEDM 2001, pp. 559-562.

Chung, Sung-Wook et al. Silicon Nanowire Devices. Applied Physics Letters, vol. 76, No. 15 (Apr. 10, 2000), pp. 2068-2070.

CMOS image sensor pixel microlens array optimization using FDTD Solutions, http://www.lumerical_com/ fdtd_microlens/cmos_image_sensor_pixel_microlens.php, pp. 1-2, Jun. 25, 2008.

CMOS image sensor pixel optical efficiency and optical crosstalk optimization using FDTD Solutions' www.lumerical.com/fdtd_microlens/cmos_image_sensor_pixel_microlens.php, Mar. 19, 2009.

Deptuch et al., Vertically Integrated Circuits at Fermilab, IEEE Transactions on Nuclear Science, Aug. 2010, vol. 54, Issue 4, pp. 2178-2186.

Dmitruk, et al.; 'Modeling and Measurement of Optical Response of 1D Array of Metallic Nanowires for Sensing and Detection Applica-

(56) References Cited

OTHER PUBLICATIONS tion': 26th International Conference on Microelectronics (MIEL 2008), Nis, Serbia, May 11-14, 2008.
Ekroll, On the Nature of Simultaneous Color Contrast, Dissertation, University of Kiel, 2005.
Fan et al., Large-Scale, Heterogeneous Integration of Nanowire Arrays for Image Sensor Circuitry, Proceedings of the National Academy of Sciences (PNAS) of the United States of America, Aug. 12, 2008, vol. 105, No. 32.
Fang et al., Fabrication of Slantingly-Aligned Silicon Nanowire Arrays for Solar Cell Applications, Nanotechnology, 2008, vol. 19, No. 25.
Furumiya, et al. 'High-sensitivity and no-crosstalk pixel technology for embedded CMOS image sensor'; IEEE Electron Device Letters, vol. 48, No. 10, Oct. 2001.
Gadelrab et al., The Source-Gated Amorphous Silicon Photo-Transistor, IEEE Transactions on Electron Devices, Oct. 1997, vol. 44, No. 10, pp. 1789-1794.
Gambino et al., 'CMOS Imager with Copper Wiring and Lightpipe,' Electron Devices Meeting, 2006. IEDM '06, International Publication Date: Dec. 11-13, 2006, pp. 1-4.
Garnett et al., Light Trapping in Silicon Nanowire Solar Cells, Nanoletters, Jan. 28, 2010, vol. 10, No. 3, pp. 1082-1087.
Ge et al., Orientation-Controlled Growth of Single-Crystal Silicon-Nanowire Arrays, Advanced Materials, Jan. 18, 2005, vol. 17, No. 1, pp. 56-61.
Geyer et al., Model for the Mass Transport during Metal-Assisted Chemical Etching with Contiguous Metal Films as Catalysts, J. Phys. Chem. C 2012, 116, 13446-13451.
Guillaumée, et al., Polarization Sensitive Silicon Photodiodes Using Nanostructured Metallic Grids, Applied Physics Letters 94, 2009.
Hanrath et al., Nucleation and Growth of Germanium Nanowires Seeded by Organic Monolayer-Coated Gold Nanocrystals, J. Am. Chem. Soc., Feb. 20, 2002, vol. 124, No. 7, pp. 1424-1429.
Hanrath et al., Supercritical Fluid-Liquid-Solid (SFLS) Synthesis of Si and Ge Nanowires Seeded by Colloidal Metal Nanocrystals, Advanced Materials, Mar. 4, 2003, vol. 15, No. 5, pp. 437-440.
Hochbaum et al., Controlled Growth of Si Nanowire Arrays for Device Integration, Nano Letters, Mar. 2005, vol. 5, No. 3, pp. 457-460.
Holmes et al., Control of Thickness and Orientation of Solution-Grown Silicon Nanowires, Science, Feb. 25, 2000, vol. 287, No. 5457, pp. 1471-1473.
Hsu, et al. 'Light Guide for Pixel Crosstalk Improvement in Deep Submicron CMOS Image Sensor'; IEEE Electron Device Letters, vol. 25, No. 1, Jan. 2004.
International Preliminary Report and Written Opinion re PCT/US2010/059468, mailed Jun. 21, 2012.
International Preliminary Report and Written Opinion re PCT/US2010/059491, mailed Jun. 21, 2012.
International Preliminary Report and Written Opinion re PCT/US2010/059496, mailed Jun. 21, 2012.
International Preliminary Report and Written Opinion re PCT/US2010/059504, mailed Jun. 21, 2012.
International Preliminary Report on Patentability for PCT International Application No. PCT/US2010/035722, mailed Nov. 3, 2011.
International Preliminary Report on Patentability for PCT International Patent Application No. PCT/U62009/055963, mailed Mar. 17, 2011.
International Preliminary Search Report on Patentability of PCT/US201-057325, mailed May 2, 2013.
International Search Report and Written Opinion for PCT International Application No. PCT/US2010/035722, mailed Jul. 20, 2010.
International Search Report and Written Opinion for PCT International Application No. PCT/US2010/035726, mailed Jul. 21, 2010.
International Search Report and Written Opinion for PCT International Application No. PCT/US2010/057227, mailed Jan. 26, 2011.
International Search Report and Written Opinion for PCT International Patent Application No. PCT/US2009/055963, mailed Oct. 15, 2009.
International Search Report and Written Opinion for PCT International Patent Application No. PCT/US2009/063592, mailed Jan. 13, 2010.
International Search Report and Written Opinion for PCT International Patent Application No. PCT/US2010/035727, mailed Sep. 27, 2010.
International Search Report and Written Opinion for PCT International Patent Application No. PCT/US2010/051435, mailed Dec. 3, 2010.
International Search Report and Written Opinion for PCT International Patent Application No. PCT/US2010/051446, mailed Jan. 3, 2011.
International Search Report and Written Opinion for PCT International Patent Application No. PCT/US2010/059468, mailed Feb. 11, 2011.
International Search Report and Written Opinion for PCT International Patent Application No. PCT/US2010/059491, mailed Feb. 9, 2011.
International Search Report and Written Opinion for PCT International Patent Application No. PCT/US2010/059501, mailed Feb. 15, 2011.
International Search Report and Written Opinion for PCT International Patent Application No. PCT/US2010/059504, mailed Apr. 7, 2011.
International Search Report and Written Opinion for PCT International Patent Application No. PCT/US2011/060348, mailed Mar. 9, 2012.
International Search Report and Written Opinion for PCT International Patent Application No. PCT/US2011/064635, mailed Apr. 13, 2012.
International Search Report and Written Opinion for PCT International Patent Application No. PCT/US2011/066097, mailed Mar. 12, 2012.
International Search Report and Written Opinion for PCT International Patent Application No. PCT/US2011/067712, mailed May 3, 2012.
International Search Report and Written Opinion re PCT/US2011/57325, mailed Jun. 22, 2012.
Jeong, et al., Nano Lett. 2012, 12, 2971-2976.
Jeong et al., J. Vac. Sci. Technol. A 30(6), Nov./Dec. 2012.
Juan et al., High Aspect Ratio Polymide Etching Using an Oxygen Plasma Generated by Electron Cyclotron Resonance Source, Journal of Vacuum Science and Technology, Jan./Feb. 1994, vol. 12, No. 1., pp. 422-426.
Junger, et. al., Polarization- and wavelength-sensitive sub-wavelength structures fabricated in the metal layers of deep submicron CMOS processes, Proc. of SPIE, vol. 7712, 2010.
Kalkofen et al., Atomic Layer Deposition of Boron Oxide as Dopant Source for Shallow Doping of Silicon, Meeting Abstract 943, 217th ECS Meeting, MA2010-01, Apr. 25-30, 2010, Vancouver Canada, El—Advanced Gate Stack, Source / Drain, and Channel Engineering for Si-Based CMOS 6: New Materials, Processes, and Equipment.
Kane, Why Nanowires Make Great Photodetectors, EurekAlert.com article, Apr. 25, 2007.
Kempa, Thomas J. et al. Single and Tandem Axial p-i-n. Nanowire Photovoltaic Devices. Nano Letters. 2008, vol. 8, No. 10, 3456-3460.
Kim et al., Electronic Structure of Vertically Aligned Mn-Doped CoFe2O4 Nanowires and Their Application as Humidity Sensors and Photodetectors, Journal of Physical Chemistry C, Apr. 7, 2009.
Kim; 'New Functional Nanomaterials Based on Block Copolymers' http://www.ziu.edu.cn/adver/subjectizyhd/jz0707061313.html, Jul. 7, 2011.
Law, et al., 'Semiconductor Nanowires and Nanotubes'; Annu. Rev. Mater. Res. 2004, 34:83-122.
Lee et al., Vertical Pillar-Superlattice Array and Graphene Hybrid Light Emitting Diodes, Nano Letters, 2010, vol. 10, pp. 2783-2788.
Lin et al., Fabrication of Nanowire Anisotropic Conductive Film for Ultra-fine Pitch Flip Chip Interconnection, Electronic Components and Technology Conference, Jun. 20, 2005, 55th Proceedings, pp. 66-70.
Lin et al., Reducing Dark Current in a High-Speed Si-Based Interdigitated Trench-Electrode MSM Photodetector, IEEE Transactions on Electron Devices, May 2003, vol. 50, No. 5, pp. 1306-1313.

(56) References Cited

OTHER PUBLICATIONS

Loncar et al., Diamond Nanotechnology, SPIE Newsroom, May 18, 2010, obtained at url: http://spie.org/x40194.xml?ArticleID=x40194.
Loose et al., CMOS Detector Technology, Scientific Detector Workshop, Sicily, 2005, Experimental Astronomy, vol. 19, Issue 1-3, pp. 111-134.
Lu et al., Growth of Single Crystal Silicon Nanowires in Supercritical Solution from Tethered Gold Particles on a Silicon Substrate, NanoLetters, Jan. 2003, vol. 3, No. 1, pp. 93-99.
Lugstein et al., Ga/Au Alloy Catalyst for Single Crystal Silicon-Nanowire Epitaxy, Applied Physics Letters, Jan. 8, 2007, vol. 90, No. 2, pp. 023109-1-023109-3.
Madou, Properties and Growth of Silicon, Including Crystalline Silicon, Fundamentals of Microfabrication, 2nd Ed., CRC Press, 2002, pp. 125-204.
Makarova et al., Fabrication of High Density, High-Aspect-Ratio Polyimide Nanofilters, Journal of Vacuum Science and Technology, Nov./Dec. 2009, vol. 27, No. 6., pp. 2585-2587.
Morales et al., A Laser Ablation Method for the Synthesis of Crystalline Semiconductor Nanowires, Science, Jan. 9, 1998, vol. 279, pp. 208-211.
Mukhopadhyay, When PDMS Isn't the Best, American Chemical Society, May 1, 2007.
Nguyen et al., Deep Reactive Ion etching of Polyimide for Microfluidic Applications, Journal of the Korean Physical Society, Sep. 2007, vol. 51, No. 3, pp. 984-988.
Pain et al., A Back-Illuminated Megapixel CMOS Image Sensor, IEEE Workshop on Charge-Coupled Devices and Advanced Image Sensors, Karuizawa, Japan, Jun. 9-11, 2005, Jet Propulsion Laboratory, National Aeronautics and Space Administration, Pasadena California.
Parraga et al., Color and Luminance Information in Natural Scenes, Journal of Optical Society of America A, Optics, Image, Science and Vision, Jun. 1998, vol. 15, No. 6.
Rosfjord et al., Nanowire Single-Photon Detector with an Integrated Optical Cavity and Anti-Reflection Coating, Optics Express: The International Electronic Journal of Optics, Jan. 23, 2006, vol. 14, No. 2, pp. 527-534.
Rugani, First All-Nanowire Sensor, Technology Review, Aug. 13, 2008, Published by MIT.
Rutter, Diamond-Based Nanowire Devices Advance Quantum Science, SEAS Communications, Feb. 14, 2010, obtained at.
Sangmoo Jeon, et al., Nano Lett. 2012, 12, 2971-2976.
Sangmoo Jeong et al., J. Vac. Sci. Technol. A 30(6), Nov./Dec. 2012.
Sarkar et. al., Integrated polarization-analyzing CMOS image sensor for detecting incoming light ray direction, Sensors Application Symposium (SAS), Mar. 29, 2012, p. 194-199, 1010 IEEE.
Schmidt et al., Realization of a Silicon Nanowire Vertical Surround-Gate Field-Effect Transistor, Small, Jan. 2006, vol. 2, No. 1, pp. 85-88.
Seo, et. al., "Multicolored vertical silicon nanowires," Nano Letters, vol. 11 issue 4, pp. 1851-1856, 2010.
Shockley, et al., Detailed Balance Limit of Efficiency of p-n Junction Solar Cells, J. of Appl. Physics, vol. 32, No. 3, Mar. 1961, 10 pages.
Song et al., Vertically Standing Ge Nanowires on GaAs(110) Substrates, Nanotechnology 19, Feb. 21, 2008.
Thelander et al., Nanowire-Based One-Dimensional Electronics, Materials Today, Oct. 2006, vol. 9, No. 10, pp. 28-35.
Trentler, Timothy J. et al. Solution-Liquid-Solid Growth of Cyrstalline III-V Semiconductors: An Analogy to Vapor Liquid-Solid Growth. vol. 270(5243), Dec. 15, 1995, pp. 1791-1794.
Tseng, et al. 'Crosstalk improvement technology applicable to 0.14 µm CMOS image sensor'; IEEE International Electron Devices Meeting, Dec. 13-15, 2004; IEDM Technical Digest, pp. 997-1000.
Verheijen, Marcel A. et al. Growth Kinetics of Heterostructured GaP-GaAs Nanowires. J. Am. Chem. Soc. 2006, 128, 1353-1359.
Wagner, R.S. and Ellis, W.C. Vapor-Liquid-Solid Mechanism of Single Crystal Growth. Applied Physics Letters. vol. 4, No. 5 (Mar. 1, 1964), pp. 89-90.
Wang, Introduction to Nanotechnology—Where Opportunities arise Great Future Being Built from Small Things, Fall 2008.
Wong et al., Lateral Nanoconcentrator Nanowire Multijunction Photovoltaic Cells, GCEP Progress report, Apr. 20, 2009, pp. 1-18.
Ye et al., Fabrication Techniques of High Aspect Ratio Vertical Lightpipes Using a Dielectric Photo Mask, SPIE, Proceedings, Feb. 2010, vol. 7591.
Zhang et al., Ultrahigh Responsivity Visible and Infrared Detection Using Silicon Nanowire Phototransistors, Nanoletters, May 14, 2010, vol. 10, No. 6, pp. 2117-2120.
Office Action issued on Oct. 29, 2014 in Korean Application No. 10-2013-7020107.
U.S. Office Action for U.S. Appl. No. 13/925,429 mailed Nov. 4, 2014.
Corrected Notice of Allowability issued on Oct. 14, 2014 in U.S. Appl. No. 12/966,535.
Taiwanese Office Action of Taiwan Patent Application No. 099116881, issued Jul. 18, 2013 (8 pages).
U.S. Office Action for U.S. Appl. No. 12/573,582, dated Jun. 28, 2012.
U.S. Office Action for U.S. Appl. No. 13/494,661, notification date Nov. 7, 2012.
Canadian Office Action of Canadian Application No. 3,676,376, dated Oct. 11, 2013.
Choi et al., Optimization of sidewall roughness in silica waveguides to reduce propagation losses, May 2001, Lasers and Electro-Optics, 2001. CLEO '01. Technical Digest. Summaries of papers presented at the Conference on, pp. 175-176.
Hopkins, Addressing sidewall roughness using dry etching silicon and Si02, Jul. 1, 2004, ElectroIQ, vol. 47, Issue 7.
Mei-Ling Kuo et al. "Realization of a near-perfect antireflection coating for silicon solar energy utilization" (Nov. 1, 2008, vol. 33, No. 21, Optics Letters).
U.S. Final Office Action for U.S. Appl. No. 12/966,514, mailed Mar. 19, 2013, 50 pages.
U.S. Final Office Action for U.S. Appl. No. 13/494,661, mailed Mar. 7, 2013, 10 pages.
U.S. Office Action for U.S. Appl. No. 12/633,313, dated Aug. 1, 2013, 20 pages.
U.S. Office Action for U.S. Appl. No. 12/966,514, dated Aug. 15, 2013, 17 pages.
U.S. Office Action for U.S. Appl. No. 12/966,535, mailed Jun. 14, 2013, 22 pages.
U.S. Office Action for U.S. Appl. No. 12/966,573, dated Aug. 6, 2013, 13 pages.
U.S. Office Action for U.S. Appl. No. 13/048,635, mailed Jun. 6, 2013, 24 pages.
U.S. Office Action for U.S. Appl. No. 13/543,307 mailed Dec. 24, 2014.
U.S. Office Action for U.S. Appl. No. 14/274,448 mailed Dec. 5, 2014.
International Search Report and Written Opinion for International Application No. PCT/US2014/056558 mailed Dec. 12, 2014.
Office Action issued on Nov. 11, 2014 in Taiwanese Application No. 098129911.
International Search Report and Written Opinion for International Application No. PCT/US2014/050544 mailed Jan. 9, 2015.
Notice of Allowance issued on Dec. 1, 2014 in U.S. Appl. No. 12/910,664.
U.S. Office Action for U.S. Appl. No. 12/966,514 mailed Sep. 23, 2014.
Berstein et al., "Modern Physics", Chapter 14, Section 6, pp. 420-421, 2000, Prentice-Hall, Inc.
University of California San Diego, Class ECE 183 Lab 1, 2013.
U.S. Office Action for U.S. Appl. No. 12/633,313 mailed Aug. 1, 2014.
U.S. Office Action for U.S. Appl. No. 13/693,207 mailed Oct. 9, 2014.
Office Action for U.S. Appl. No. 13/693,207 mailed May 7, 2015.
Kim, Y.S. et al., "ITO/AU/ITO multilayer thin films for transparent conducting electrode applications", Applied Surface Science, vol. 254 (2007), pp. 1524-1527.
Office Action for U.S. Appl. No. 13/543,307 mailed Apr. 17, 2015.

(56) References Cited

OTHER PUBLICATIONS

Office Action issued Mar. 19, 2015 in Chinese Application No. 201180065814.8.
Office Action for U.S. Appl. No. 13/288,131 mailed Apr. 17, 2015.
Office Action for U.S. Appl. No. 14/281,108 mailed Apr. 6, 2015.
Office Action for U.S. Appl. No. 14/450,812 mailed Apr. 1, 2015.
Office Action for U.S. Appl. No. 12/633,313 mailed Apr. 9, 2015.
Office Action issued on Mar. 18, 2015 in Chinese Application No. 201180066970.6.
Office Action issued May 15, 2015 in U.S. Appl. No. 14/274,448.
Office Action for U.S. Appl. No. 12/982,269 mailed May 22, 2015.
Kosonocky, et al., 160×244 Element PtSi Schottky-Barrier IR-CCD Image Sensor, IEEE Transactions on Electron Devices, vol. Ed-32, No. 8, Aug. 1985.
Office Action issued Apr. 3, 2015 in Chinese Application No. 201180051048.X.
Office Action issued May 22, 2015 in Taiwanese Application No. 099142971.
Office Action mailed May 26, 2015 in Japanese Application No. 2014 138265.
Office Action for U.S. Appl. No. 14/068,864 mailed Jun. 15, 2015.
Office Action issued on May 5, 2015 in Chinese Application No. 201410264248.9.
Notice of Allowance issued Jan. 30, 2015 in U.S. Appl. No. 14/487,375.
Office Action for U.S. Appl. No. 12/982,269, mailed Jan. 15, 2015.
Office Action for U.S. Appl. No. 12,945,492 mailed Jan. 16, 2015.
Office Action for U.S. Appl. No. 12/966,514 mailed Mar. 10, 2015.
Office Action issued on Jan. 16, 2015 in Chinese Application No. 201180054442.9.
Office Action issued Feb. 23, 2015 in U.S. Appl. No. 13/925,429.
Office Action issued on Mar. 4, 2015 in U.S. Appl. No. 13/556,041.
Bernstein et al. "Modern Physics", Chapter 14, Section 6, pp. 420-421, 2000 by Prentice-Hall Inc.
Jin-Kon Kim; 'New Functional Nanomaterials Based on Block Copolymers' http://www.ziu.edu.cn/adver/subjectizyhd/jz0707061313.html, Jul. 11, 2007.
Ozgur Yavuzcetin, et al.; 'Index-tuned Anti-reflective Coating using a Nanostructured Metamaterial'; http://www.umass.edu/research/rld/bioportal/vuewtech.php?tid=40, Feb. 28, 2007.
Reynard Corporation; 'Anti-Reflection Coatings (AR)', http://www.reynardcorp.com/coating_anti_reflection.php, dowwnloaded Jun. 4, 2009.
Shimizu et al., Homoepitaxial Growth of Vertical Si Nanowires on Si(100) Substrate using Anodic Aluminum Oxide Template, (abstract only), Materials Research Society, Fall 2007.
Wang, Introduction to Nanotechnology—Where Opportunities arise & Great Future Being Built from Small Things, Fall 2008.
Office Action for U.S. Appl. No. 14/450,812 mailed Jul. 23, 2015.
Office Action for U.S. Appl. No. 14/293,164 mailed Aug. 14, 2015.
Office Action issued Jul. 9, 2015 in Taiwanese Application No. 102124069.
A. Gu et al., "Design and growth of III-V nanowire solar cell arrays on low cost substrates," Conf. Record, 35rd IEEE Photovoltaic Specialists Conference, Honolulu, Jun. 2010, pp. 20-25.
Office Action issued Jun. 23, 2015 in Chinese Application No. 201310284409.6.
Office Action for U.S. Appl. No. 12/966,514 mailed Nov. 2, 2015.
Office Action for U.S. Appl. No. 12/633,313 mailed Oct. 21, 2015.
Office Action for U.S. Appl. No. 12/945,492 mailed Sep. 9, 2015.
Office Action for U.S. Appl. No. 14/459,398 mailed Sep. 16, 2015.
Office Action for U.S. Appl. No. 14/274,448 mailed Aug. 26, 2015.
Office Action for U.S. Appl. No. 13/288,131 mailed Oct. 22, 2015.
Office Action for U.S. Appl. No. 14/450,812 mailed Oct. 28, 2015.
Office Action for U.S. Appl. No. 12/945,429 mailed Sep. 4, 2015.
Office Action dated Oct. 6, 2015 in Taiwanese Application No. 100141376.
Office Action dated Sep. 11, 2015 in Taiwanese Application No. 103143553.
International Search Report and Written Opinion mailed Nov. 27, 2015 in International Application No. PCT/US2015/038999.
Office Action issued Aug. 12, 2015 in Chinese Application No. 201180054442.9.
Office Action mailed Sep. 30, 2015 in Japanese Application No. 2014-094365.
Office Action issued on Nov. 25, 2015 in Japanese Application No. 2015-005091.
Office Action issued Nov. 17, 2015 in Taiwanese Application 103102171.
Office Action issued Nov. 20, 2015 in Taiwanese Application 104108370.
Office Action issued on Nov. 27, 2015 in Taiwanese Application No. 100138526.
International Search Report and Written Opinion mailed Jan. 8, 2016 in International Application No. PCT/US2015/055728.
Office Action issued Jan. 4, 2016 in U.S. Appl. No. 14/311,954.
Office Action issued Jan. 5, 2016 in U.S. Appl. No. 14/291,888.
Office Action issued Nov. 9, 2015 in U.S. Appl. No. 14/503,598.
Office Action issued Jan. 15, 2016 in U.S. Appl. No. 14/632,739.
Office Action issued Jan. 4, 2016 in U.S. Appl. No. 14/293,164.
Office Action issued Jan. 7, 2016 in U.S. Appl. No. 14/322,503.
Office Action issued Jan. 14, 2016 in U.S. Appl. No. 14/459,398.
Office Action issued Dec. 28, 2015 in Taiwanese Application No. 102149110.
Office Action issued Dec. 25, 2015 in Chinese Application No. 201410264248.9.
Office Action issued Dec. 30, 2015 in Taiwanese Application No. 104123757.
International Search Report and Written Opinion mailed Nov. 27, 2015 in International Application PCT/US2015/038999.
Office Action issued Jan. 15, 2016 in Chinese Application No. 201180066970.6.
International Preliminary Report on Patentability issued Feb. 9, 2016 in International Application PCT/US2014/050544.
International Search Report and Written Opinion mailed Feb. 9, 2016 in International Application PCT/US2015/55710.
Office Action issued Feb. 4, 2016 in U.S. Appl. No. 14/274,448.
Office Action issued Mar. 7, 2016 in U.S. Appl. No. 14/450,812.
Office Action issued Feb. 25, 2016 in Chinese Application No. 201180051048.
Office Action issued Feb. 1, 2016 in Taiwanese Application 102124069.
Office Action issued Feb. 6, 2016 in Chinese Application No. 201180054442.9.
Office Action mailed Mar. 29, 2016 in Japanese Application No. 2014-138265.
International Preliminary Report on Patentability issued on Mar. 22, 2016 in International Application PCT/US2014/056558.
Decision issued on Jan. 30, 2016 in Taiwanese Application 099142971.

* cited by examiner

NANOWIRE STRUCTURED COLOR FILTER ARRAYS AND FABRICATION METHOD OF THE SAME

BACKGROUND

An image sensor may be fabricated to have a large number of identical sensor elements (pixels), generally more than 1 million, in a (Cartesian) square grid. The pixels may be photodiodes, or other photosensitive elements, that are adapted to convert electromagnetic radiation into electrical signals. Recent advances in semiconductor technologies have enabled the fabrication of nanoscale semiconductor components such as nanowires.

Nanowires have been introduced into solid state image devices to confine and transmit electromagnetic radiation impinging thereupon to the photosensitive elements. These nanowires can be fabricated from bulk silicon which appears gray in color, although researchers have patterned the surface of silicon so it "looks" black and does not reflect any visible light.

However, nanowires configured to selectively absorb (or to lower the reflectance of) light at a predetermined wavelength have not been fabricated.

SUMMARY

The disclosures of U.S. patent application Ser. Nos. 12/204,686, 12/648,942, 13/556,041, 12/270,233, 12/472,264, 12/472,271, 12/478,598, 12/573,582, 12/575,221, 12/633,323, 12/633,318, 12/633,313, 12/633,305, 12/621,497, 12/633,297, 12/982,269, 12/966,573, 12/967,880, 12/966,514, 12/974,499, 12/966,535, 12/910,664, 12/945,492, 13/047,392, 13/048,635, 13/106,851, 13/288,131, 13/543,307, and 13/693,207, are each hereby incorporated by reference in their entirety.

In some embodiments, a color filter array is described. The color filter array may include a substrate having a plurality of pixels thereon, one or more nanowires associated with each of the plurality of pixels and an optical coupler associated with each of the one or more nanowires. The one or more nanowires extend substantially perpendicularly from the substrate.

In some embodiments, each of the one or more nanowires is configured to absorb a fundamental frequency of light, the fundamental frequency being correlated with the diameter of the nanowire. The nanowires may also absorb harmonic frequencies of light in some embodiments.

In some embodiments, a method of making a color filter array is described. The method may include providing a pixel array having a plurality of pixels, wherein a hard polymer substantially covers an image plane of the pixel array, making an array of nanowires, wherein each of the nanowires extends substantially perpendicularly from a substrate, disposing a transparent polymer material to substantially encapsulate the nanowires, removing the nanowires from the substrate, disposing the array of nanowires on the pixel array, and removing the transparent polymer encapsulating the nanowires.

In some embodiments, the array of nanowires is aligned on the pixel array such that each of the plurality of pixels is aligned with one or more nanowires.

In some embodiments, the pixel array may include an image sensor having a charge coupled device (CCD) array, or a complementary metal (CMOS) sensor array.

This disclosure is not limited to the particular systems, devices and methods described, as these may vary. The terminology used in the description is for the purpose of describing the particular versions or embodiments only, and is not intended to limit the scope.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this disclosure is to be construed as an admission that the embodiments described in this disclosure are not entitled to antedate such disclosure by virtue of prior invention. As used in this document, the term "comprising" means "including, but not limited to."

BRIEF DESCRIPTION OF THE DRAWINGS

In the present disclosure, reference is made to the accompanying drawings, which form a part hereof. In the drawings, similar symbols typically identify similar components, unless context dictates otherwise. Various embodiments described in the detailed description, drawings, and claims are illustrative and not meant to be limiting. Other embodiments may be used, and other changes may be made, without departing from the spirit or scope of the subject matter presented herein. It will be understood that the aspects of the present disclosure, as generally described herein, and illustrated in the Figures, can be arranged, substituted, combined, separated, and designed in a wide variety of different configurations, all of which are contemplated herein.

DETAILED DESCRIPTION

Described herein are color filter arrays and methods of making color filter arrays. A color filter array may include one or more nanowires associated with each of a plurality of pixels of a pixel array such that each of the one or more nanowires extends substantially perpendicularly from the surface of the pixel array. Each of the nanowires may be associated with an optical coupler configured to direct light into the nanowires. The nanowires may be made from group IV semiconductor (e.g. silicon) or a III-V semiconductor (e.g. gallium arsenide).

Without wishing to be bound by theory, it is contemplated that light can couple into guided mode in individual nanowires depending on their diameter. Longer wavelengths can couple into larger diameter nanowires. Such coupling of a particular wavelength of light into an individual nanowire can result in near perfect absorption (as high as 98%) of that wavelength of light. As such, if such a nanowire is exposed to white light, emerging light will have the coupled wavelength subtracted from the white light. Thus, an array of nanowires having different diameters can act as a filter to subtract various wavelengths of light depending on the different diameters of nanowires. By choosing an appropriate distribution of nanowire diameters across the array, it is contemplated that, a color filter can be designed for filtering out particular colors or color shades.

It will be understood that factors such a material of the nanowire, length of the nanowire, material surrounding the nanowire, and so forth may determine the particular relationship between diameter of the nanowire and the absorbed wavelength. As such, for example, a nanowire of silicon having a diameter of about 90 nm to about 110 nm can subtract red light, while a nanowire of gallium arsenide having the same diameter may subtract a different wavelength. Likewise, if a silicon nanowire is surrounded by a material other than air, the wavelength subtracted by the nanowire may change.

Figure 1:
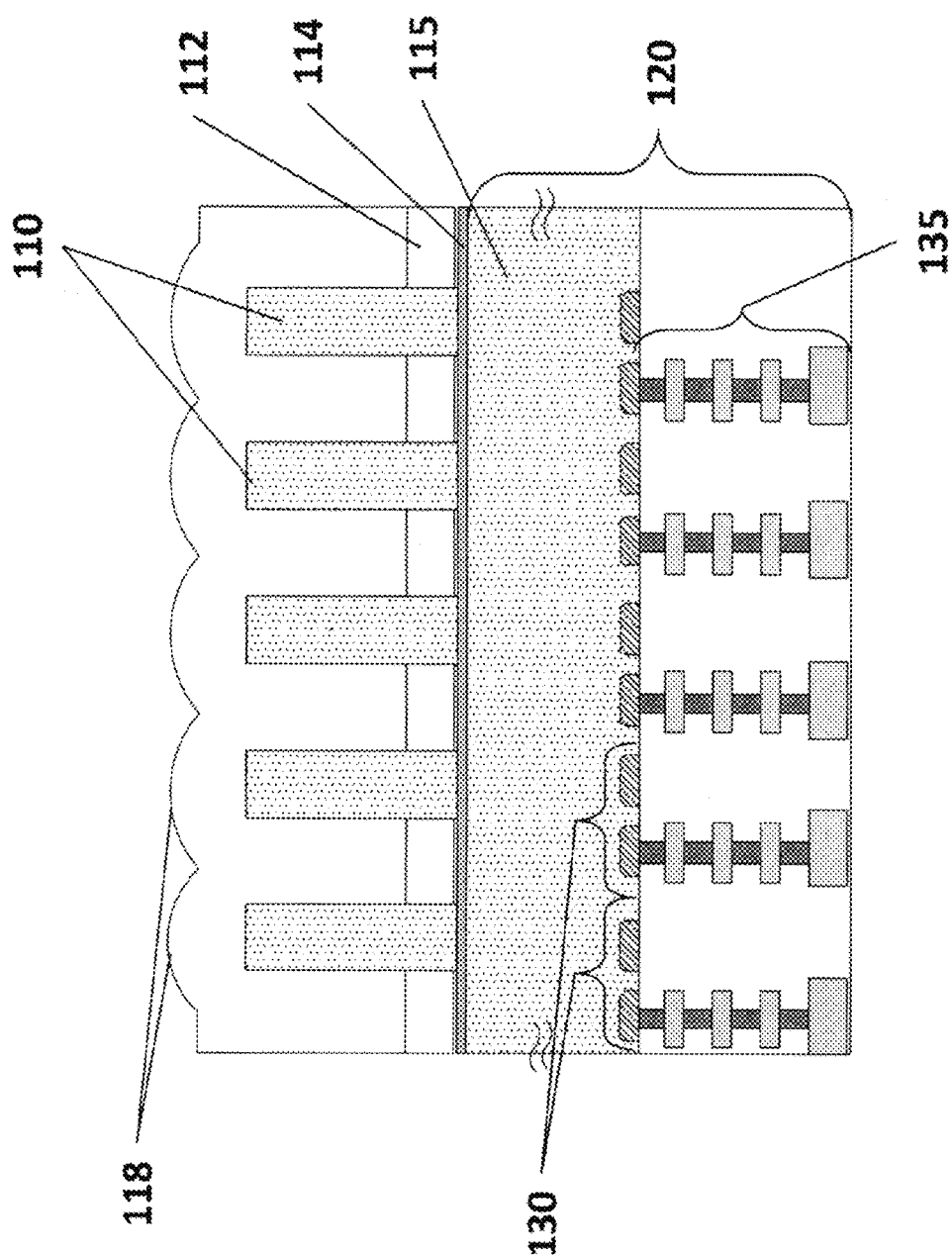
FIG. 1 depicts an illustrative example of a color filter array according to an embodiment.

FIG. 1 depicts an illustrative example of a color filter array according to an embodiment. Color filter array 100 includes substrate 115 having passivation layer 114, a plurality of pixels 130 thereon, one or more nanowires 110 associated with each of the plurality of pixels 130 and optical coupler 118 associated with each of the one or more nanowires. Nanowires 110 extend substantially perpendicularly to substrate 115. In some embodiments, substrate 115 may further include image sensor 135. In various embodiments, substrate 115 and nanowires 110 may be fused at intermediate layer 112. In various embodiments, passivation layer 114 may be an oxide of the substrate material or a doped semiconductor layer.

It is to be understood that FIG. 1 is illustrative and not to scale. As such, dimensions and aspect ratios of various aspects of color filter array 100 shown in FIG. 1 are not meant to be limiting.

In various embodiments, each of the one or more nanowires 110 may absorb a fundamental frequency of light depending on the diameter of nanowire 110. As discussed elsewhere herein, it is to be understood that while the fundamental frequency of the absorbed light may be primarily dependent on the diameter of nanowire 110, other factors such as the material of the nanowire, the material surrounding the nanowire, length of the nanowire, and so on may determine the relationship between the diameter and the fundamental frequency. As such, it will be appreciated that all other things remaining the same, the fundamental frequency of light absorbed by a nanowire may depend linearly an the diameter of the nanowire.

Likewise, it will be appreciated that a harmonic frequency of light may be absorbed by a nanowire of a certain diameter. For example, if a particular nanowire absorbs light having a frequency of 375 THz (wavelength of 800 nm), the same nanowire may absorb light having a second harmonic frequency of 750 THz (wavelength of 400 nm). It is to be understood that higher harmonics may be similarly absorbed where applicable. For example, if the incident light has frequencies ranging from far infrared (FIR) region of the electromagnetic spectrum to deep ultraviolet (DUV) region of the electromagnetic spectrum, it may be possible to find third or even fourth harmonics within the incident light. Likewise, if the incident light has frequencies ranging from FIR region of the electromagnetic spectrum to X-ray region of the electromagnetic spectrum, further higher harmonics may be absorbed by nanowires with diameters large enough to absorb light in FIR region of the electromagnetic spectrum.

In some embodiments, nanowires 110 may have a diameter of about 10 nm to about 200 μm. Certain embodiments may have nanowires 110 having a diameter of about 10 nm to about 50 nm, about 50 nm to about 75 nm, about 75 nm to about 100 nm, about 75 nm to about 120 nm, about 120 nm to about 1000 nm, about 1 μm to about 10 μm, about 10 μm to about 100 μm, about 100 μm to about 200 μm, or any value or range between any two of these values.

For nanowires made from intrinsic (undoped) silicon, nanowires 110 having a diameter of less than about 50 nm can absorb light in the ultraviolet (UV) region of the electromagnetic spectrum; nanowires having diameters of about 50 nm to about 75 nm can absorb light in the blue region of the electromagnetic spectrum; nanowires having diameters of about 75 nm to about 100 nm absorb light in the green region of the electromagnetic spectrum; nanowires having diameters of about 90 nm to about 120 nm can absorb light in the red region of the electromagnetic spectrum; and nanowires having diameters of larger than about 115 nm can absorb light in the infrared (IR) region of the electromagnetic spectrum.

Nanowires may be made from various materials. Some materials may be preferable than others based on their optical properties. For example, certain group IV semiconductors or III-V semiconductors may be preferred in some embodiments depending on their band-gap and refractive index. Examples, of materials that may be used for making the nanowires include, but are not limited to, silicon (Si), germanium (Ge), boron phosphide (BP), boron arsenide (BAs), aluminum phosphide (AlP), aluminum arsenide (AlAs), aluminum antimonide (AlSb), gallium nitride (GaN), gallium phosphide (GaP), gallium arsenide (GaAs), gallium antimonide (GaSb), indium nitride (InN), indium phosphide (InP), indium arsenide (InAs), zinc oxide (ZnO), zinc sulfide (ZnS), zinc selenide (ZnSe), zinc telluride (ZnTe), cadmium sulfide (CdS), cadmium selenide (CdSe), and cadmium telluride (CdTe). Other examples of materials that may be used for making nanowires may include transparent semiconductor oxides such as silicon dioxide or transparent nitrides such as silicon nitride.

Returning to FIG. 1, nanowires 110 in color filter array 100 may have any convex cross-sectional shape. For example, the nanowires may be circular in cross-section in some embodiments. In other embodiments, the nanowires may have, for example, elliptical, square, rectangular, pentagonal, hexagonal, octagonal, or any other regular or irregular polygonal shape. It is to be understood that while the illustration in FIG. 1 shows a uniform cross-section along the length of nanowires 110, it is contemplated within the scope and spirit of the present disclosure to have nanowires with non-uniform cross-section along the length of the nanowire. For example, in some embodiments, the cross-section area of the nanowires may increase along the length from the free-standing end of the nanowire to the substrate such that the portion of the nanowire which is in contact with the substrate has the largest cross-section area. In other embodiments, it is contemplated that the free-standing end of the nanowire may have the largest cross-section area. Without wishing to be bound by theory, it is contemplated that there may be some advantages in having non-uniform cross-sections (e.g. in case of conical nanowires).

It will be understood that because of the nanowires extend substantially perpendicularly from the substrate, length of the nanowire may also be referred to as height of the nanowire. The ratio of length (or height) to diameter (or, in case of a nanowire with a polygonal cross-section, the largest side) is referred to as aspect ratio of the nanowire. In various embodiments, the nanowires may have an aspect ratio of about 2 to about 20. Typically, it is more difficult to fabricate vertically standing nanowires having large aspect ratios. While theoretically, the nanowires may have aspect ratios as high as 1000, practically achievable aspect ratios of nanowires 110 may be limited by fabrication techniques. One of skill in the art will also understand that in some embodiments, practically achievable aspect ratio may be limited by the physical properties of the nanowire material. Thus, depending on the particular techniques used to fabricate the nanowires, it is contemplated that nanowires having smaller diameters may have relatively shorter lengths. Nanowires 110 of color filter array 100 may have lengths of about 0.1 µm to about 20 µm.

In various embodiments, image sensor 135 may be a charge coupled device (CCD) or a complementary metal-oxide-semiconductor (CMOS) sensor array. Each of the image sensors 135 that form the sensor array may be associated with one or more of the plurality of pixels 130. Likewise, each of the pixels 130 may be associated with one or more nanowires. Thus, in some embodiments, light received by each nanowire may be transmitted to a single image sensor 135. In some embodiments, more than one nanowire may transmit light to one image sensor 135. It is contemplated that a group of nanowires having different diameters may be associated with each of the pixels 130 such that a particular mix of colors is subtracted from the light received at pixel 130, thereby transmitting light of a particular color to image sensor 135 which can then sense the intensity of the received light.

Image sensor 135 array is typically arranged as a rectangular (or Cartesian) grid. In various embodiments, nanowires 110 may be arranged to form an array corresponding to image sensor 135 array. For example, in embodiments where a one-to-one correspondence between nanowires and image sensors exists, the nanowire array may be identical in pitch and shape to the image sensor array. Likewise, in embodiments where a multi-to-one correspondence between nanowires and image sensors exists, each grid-point of the array of nanowires may have multiple nanowires, forming a sub-array which is repeated with a pitch and shape identical to that of the image sensor array.

Color filter 100 may additionally include optical couplers 118 such as, for example, microlenses, disposed at the light receiving end of nanowires 110. Such optical couplers, typically, serve to improve coupling of light by guiding more light into the nanowires, thereby increasing the efficiency of color filter 100. In certain embodiments, each of optical couplers 118 may correspond to a single nanowire 110, while in other embodiments, each of the optical couplers may be associated with more than one nanowire.

Figure 2:
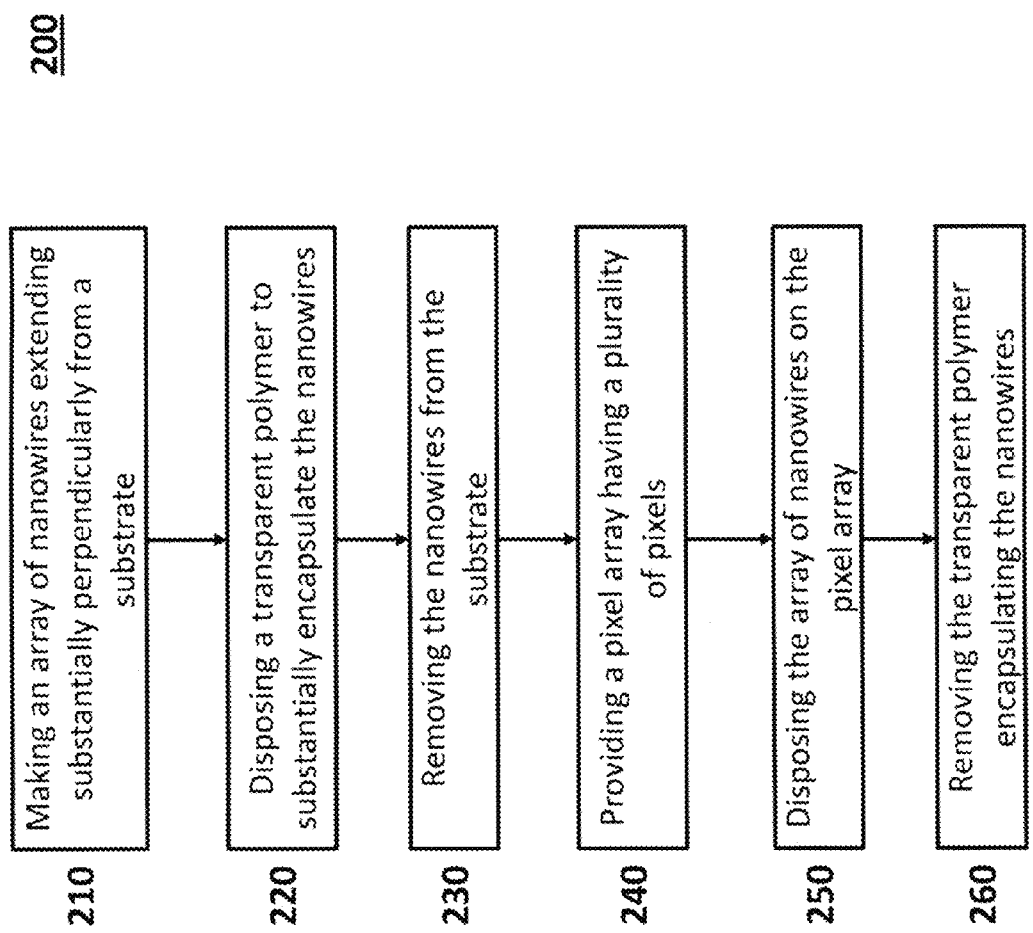
FIG. 2 depicts a process of making a color filter array according to an embodiment.

FIG. 2 depicts a process of making a color filter array according to an embodiment. It is to be understood that those skilled in the art will be able to optimize process parameters for various steps of the process with reasonable experimentation. Such process parameters will depend on factors such as, for example, particular materials used, geometry of desired features conditions in the processing environment and so forth, it is also to be understood that changing the order of steps may yield same or similar results depending on the particular process and materials being used. As such, the process and the order in which various steps are described herein are not to be considered limiting. Those skilled in the art will be able to suitably modify the process within the scope and spirit of this disclosure. In various embodiments, one or more of the illustrated steps may be omitted. One skilled in the art will be able to decide which steps can be omitted based on factors such as, for example, particular materials used, material quality, available reagents, available equipment, and so forth, while still obtaining the desired result.

Process 200 of making a color filter array may include making 210 an array of nanowires extending substantially perpendicularly from a substrate, disposing 220 a transparent polymer to substantially encapsulate the nanowires, removing 230 the nanowires from the substrate, providing 240 a pixel array having a plurality of pixels, disposing 250 the array of nanowires on the pixel array and removing 260 the transparent polymer encapsulating the nanowires.

Figure 3:
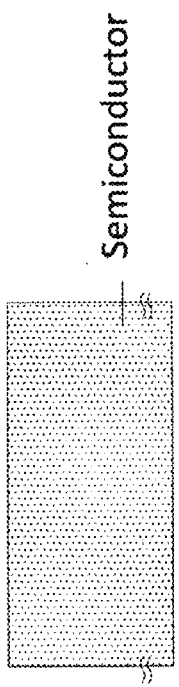
FIG. 3 schematically depicts the process of making an array of nanowires extending substantially perpendicularly from a substrate according to an embodiment.
Figure 3:
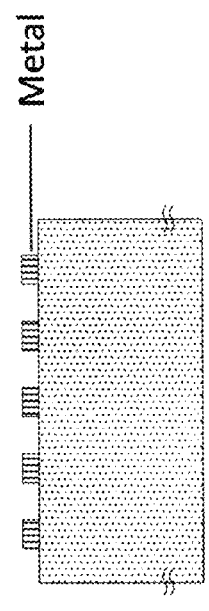
Figure 3:
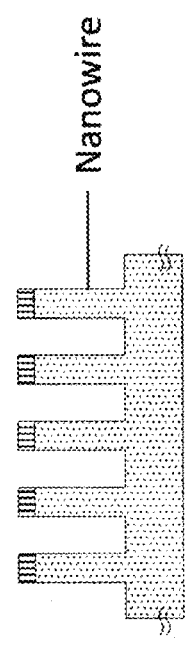
Figure 3:
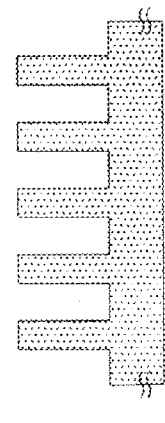

FIG. 3 schematically depicts the process of making 210 an array of nanowires extending substantially perpendicularly from a substrate according to an embodiment. At process 211 a semiconductor substrate is cleaned. At process 212 an array pattern is obtained in a thin layer of metal. At process 213 the semiconductor substrate is etched to a pre-determined depth. At process 214 the metal layer is removed using a suitable process to leave behind the nanowires extending substantially perpendicularly from the semiconductor substrate.

In some embodiments, the array pattern of process 212 may be obtained using various lithography techniques. For example, in one embodiment, a thin film of a photoresist may be deposited on the substrate by, for example, spin-coating or spray-coating. An array pattern is drawn into the photoresist using a lithography step such that specific portions of the photoresist may be removed by a solvent while other portions are left behind. In some embodiments, the array pattern may be drawn by, for example, photolithography or electron beam lithography. Following the lithography step a metal thin film is deposited using, for example, chemical vapor deposition, sputtering, pulsed laser deposition, thermal evaporation, electron beam evaporation, and/or the like. The photoresist is then lifted-off, for example, by dissolving in a suitable solvent, to leave behind an array pattern in the metal thin film.

In another embodiment, a metal thin film is deposited on the substrate, a photoresist is deposited on top of the metal thin film, the array pattern is drawn into the photoresist using a lithography step such that specific portions of the photoresist may be removed by a solvent while other portions are left behind, the metal is removed by a suitable process and the photoresist is removed to leave behind the array pattern in the metal thin film.

In some embodiments, the substrate may be etched 213 using dry or wet chemical etching techniques. Wet chemical etching may include treating the substrate with a suitable chemical etchant that can dissolve the substrate material. A chemical that can etch along a particular crystal plane of the substrate material may be preferred in such embodiments. For example, potassium hydroxide (KOH) or tetramethyl ammonium hydroxide (TMAH) may be used for etching silicon. In various embodiments, it may be preferable to use dry etching at this step so as to avoid reaction with the metal thin film that can act as an etch mask. Dry etching may include, for example, physical sputtering such as ion milling or plasma milling, plasma etching, or reactive ion etching (RIE). Reactive ion etching using specific gases or plasmas for removing the semiconductor. For example, gases such as sulfur hexafluoride, tetrafluoro methane, or octafluorocyclobutane may be used for etching silicon. Likewise, chlorine, or mixture of chlorine and boron trichloride may be used for etching gallium arsenide. Skilled artisans will be able to choose suitable gases and suitable metal masks for particular substrate materials.

Figure 3A:
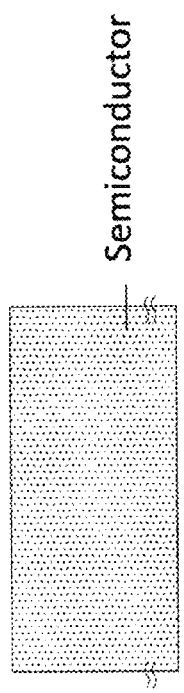
FIG. 3A schematically depicts an alternative embodiment of the process of making an array of nanowires extending substantially perpendicularly from a substrate.
Figure 3A:
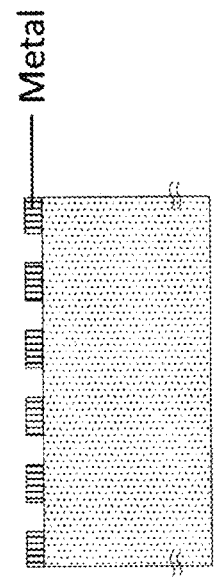
Figure 3A:
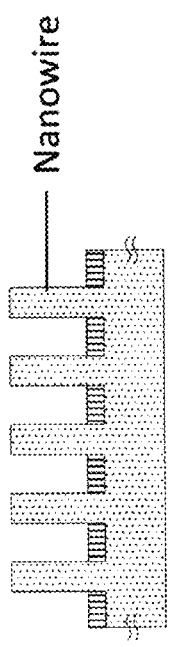
Figure 3A:
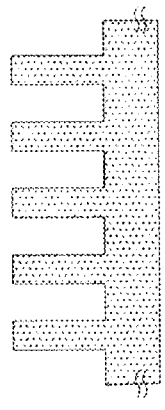

Alternatively, as depicted in FIG. 3A, at process 212A, an array pattern with openings in the metal layer such that substrate is exposed through the openings. Such a pattern may be obtained using techniques similar to those described with respect process 212 above, with the difference being in the lithography step. In process 212A, for example, the photoresist is removed to leave behind the array pattern of followed by deposition of a metal and subsequently lifting off the photoresist resulting in a pattern of openings in the metal film. Alternatively, a metal thin film may be deposited first, followed by patterning the photoresist with an array pattern of openings within the photoresist. The metal may, then, be etched with a suitable etchant such that the array pattern of openings is transferred through the metal to expose the substrate. Removal of the photoresist layer, then, results in a metal film with a pattern of openings where the substrate is exposed.

In such embodiments, metal-assisted chemical etching may be used at process 213A to etch the substrate beneath the metal film. In metal-assisted chemical etching, the etchant includes a suitable acid, for example, hydrofluoric acid when the substrate is Si or Ge, and an oxidizing agent such as hydrogen peroxide ($H_2O_2$), with the metal acting as a catalyst for reducing the oxidizing agent. The oxidizing agent, while being reduced, oxidizes the substrate to orm an oxide which is dissolved by the acid. As the substrate is etched, the metal layer caves-in without peeling off the substrate and thereby, continuously supplying the etchant to the substrate.

The metal may be removed, at process 214, by dissolving in a suitable etchant. In some embodiments, the metal may be removed using a dry etching process by exposing the metal to, for example, oxygen plasma, a beam of high energy electrons, a beam of high energy ions, ionized gas, and/or the like.

Returning to FIG. 2, at block 220 a transparent polymer is disposed on the substrate so as to substantially encapsulate the nanowires. The transparent polymer may be, for example, polydimethyl siloxane (PDMS), polymethyl methacralate (PMMA), polyethylene terephthalate (PET), or the like. The transparent polymer may be disposed by, for example, pouring or spraying the polymer on to the substrate. In some embodiments, the substrate may be cured or annealed for a specified amount of time at a particular temperature following spraying or pouring of the polymer. The polymer, in various embodiments, may have a thickness that is larger than the height of the nanowires. For example, if the nanowires are about 15 µm high, the polymer may have a thickness of about 15.5 µm, 16 µm, 20 µm, 25 µm, 50 µm, 100 µm, or any thickness between any two of these values.

At block 230, the substrate is etched away to remove the nanowires from the substrate. Etching the substrate may include physical sputtering (such as ion milling), dry etching, wet etching, chemical mechanical polishing or any combination thereof. Alternatively, the nanowire array may be mechanically detached from the substrate by scrapping or undercutting the nanowire array, for example, using a razor blade.

At block 240, a pixel array having a plurality of pixels is provided. The pixel array may include a layer of hard polymer that substantially covers an image plane of the pixel array. Examples of a hard polymer include, but are not limited to, polyimide, epoxy resin, and the like, or any combination thereof. The hard polymer may be disposed using, for example, spray coating, spin coating, electro-spinning, pouring, and the like, or any combination thereof. In some embodiments, the pixel array may include a Cartesian grid of pixels. In some embodiments, each of the plurality of pixels may be associated with a light sensing device such as a CCD sensor or a CMOS sensor. In other embodiments, more than one pixels may be associated with one light sensing device.

Figure 4:
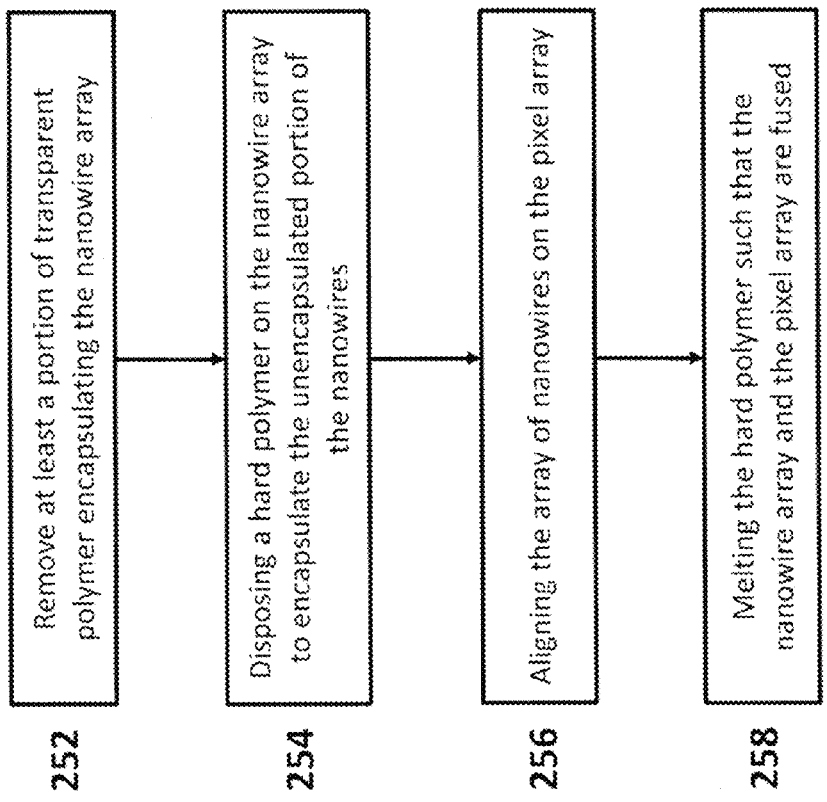
FIG. 4 depicts a process of disposing the array of nanowires on the pixel array according to an embodiment.

FIG. 4 depicts a process of disposing 250 the array of nanowires on the pixel array according to an embodiment. At process 252, at least a portion of the transparent polymer encapsulating the nanowires is removed (using, for example, oxygen plasma etch, dry etch, or controlled dissolution in a suitable solvent) such that at least a portion of nanowires is not encapsulated by the transparent polymer.

At process 254, a hard polymer such as, for example, polyimide is disposed such that the unencapsulated portion of the nanowires is substantially encapsulated by the hard polymer. In some embodiments, the hard polymer encapsulating a portion of the nanowires may be the same as the hard polymer covering the pixel array. The nanowire array is disposed on the pixel array such that hard polymers of the two arrays are in contact. The hard polymer may be disposed using, for example, spray-coating, spin-coating or pouring the hard polymer on the nanowire array.

At process 256, the nanowire array is aligned on the pixel array such that the hard polymer encapsulating the nanowires is in contact with the hard polymer disposed on the pixel array. As discussed elsewhere herein, in embodiments where a single nanowire is associated with each pixel, the shape and pitch of the nanowire array will be identical to the shape and pitch of pixel array. Likewise, in embodiments where more than one nanowire is associated with a single pixel, an appropriate number of nanowires form a group arranged in an array with the shape and pitch of the pixel array. In various embodiments, it may be preferable to provide suitable alignment marks on the pixel array and on the nanowire array to allow proper positioning of the nanowire array on the pixel array.

Once the pixel array and the nanowire array are properly aligned, at process 258, the two arrays may be fused together by melting the hard polymer. The hard polymer may be melted, in some embodiments, by heating the assembly of the pixel array and the nanowire array to an appropriate temperature (depending on the melting point or glass transition temperature of the hard polymer or polymers) for a relatively short period of time. In other embodiments, the arrays may be fused together by, for example, ultrasound welding. It will be understood that the particular process, and parameters (such as frequency, intensity, time, temperature and so on) used therefor, for fusing together the nanowire array and the pixel array will depend on the particular materials used in making the color filter array.

Returning to FIG. 2, at block 260, the transparent polymer encapsulating the nanowires is removed. As discussed elsewhere herein, the transparent polymer may be removed by reactive ion etching, oxygen plasma etching, or dissolving in a suitable solvent. Other suitable techniques for removing the transparent polymer are contemplated in the scope of this disclosure.

In some embodiments, process 200 of making the color filter array may optionally include disposing (not shown) a material having a lower refractive index than a material of the nanowires. The lower refractive index may be disposed such that the space between the nanowires may be substantially filled with the lower refractive index material. In various embodiments, the lower refractive index material may be disposed using, for example, chemical vapor deposition, atomic layer deposition, or other suitable techniques compatible with the various materials used.

In some other embodiments, process 200 may further optionally include disposing (not shown) a plurality of optical couplers such that each of the plurality of optical couplers is associated with at least one nanowire of the nanowire array. The optical couplers may include structures such as, for example, microlenses. As discussed elsewhere herein, the optical couplers may increase the light capture efficiency of the color filter array by guiding radiation into each of the nanowires.

The foregoing detailed description has set forth various embodiments of the devices and/or processes by the use of diagrams, flowcharts, and/or examples. Insofar as such diagrams, flowcharts, and/or examples contain one or more functions and/or operations, it will be understood by those within the art that each function and/or operation within such diagrams, flowcharts, or examples can be implemented, individually and/or collectively, by a wide range of hardware, software, firmware, or virtually any combination thereof.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

All references, including but not limited to patents, patent applications, and non-patent literature are hereby incorporated by reference herein in their entirety.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method of making a color filter array, the method comprising:
    making nanowires, wherein each of the nanowires extend substantially perpendicularly from a substrate;
    disposing a transparent polymer to substantially encapsulate the nanowires;
    removing the nanowires from the substrate; providing a pixel array comprising a plurality of pixels, wherein a hard polymer substantially covers an image plane of the pixel array;
    disposing the nanowires on the pixel array; and
    removing the transparent polymer encapsulating the nanowires;
    wherein making the nanowires comprises generating an array of dots in a resist layer on the substrate and forming the nanowires by etching the substrate, wherein shapes and sizes of the dots determine the cross-sectional shapes and sizes of the nanowires.

2. The method of claim 1, wherein the pixel array comprises an image sensor including a charge-coupled device (CCD) array or a complementary metal-oxide-semiconductor (CMOS) sensor array.

3. The method of claim 1, wherein the nanowires are arranged in an array having substantially a same shape and pitch as that of the pixel array.

4. The method of claim 1, wherein generating the array of dots comprises using a lithography technique.

5. The method of claim 1, wherein the etching is dry etching.

6. The method of claim 1, wherein the transparent polymer comprises polydimethyl siloxane (PDMS), or polymethyl methacralate (PMMA).

7. The method of claim 1, wherein disposing the transparent polymer comprises depositing the transparent polymer by spraying or pouring.

8. The method of claim 1, wherein removing the nanowires from the substrate comprises wet etching the substrate, removing the substrate using chemical mechanical polishing or mechanically detaching the nanowire array from the substrate by scrapping or undercutting the nanowire array.

9. The method of claim 1, wherein disposing the nanowires on the pixel array comprises:
    removing at least a portion of the transparent polymer material such that at least a portion of the nanowires is not encapsulated;
    disposing the hard polymer such that the hard polymer encapsulates at least a portion of nanowires not encapsulated by the transparent polymer;
    aligning the nanowires on the pixel array such that the hard polymer encapsulating the nanowires is in contact with the hard polymer disposed on the pixel array, wherein each of the plurality of pixels is aligned with one or more nanowires; and
    melting the hard polymer such that the nanowires fuses with the pixel array.

10. The method of claim 1, further comprising disposing a material having a lower refractive index than a material of the nanowires such that the material having the lower refractive index than the material of the nanowires substantially fills a space between the nanowires.

11. The method of claim 10, wherein the material having the lower refractive index than the material of the nanowires is disposed using chemical vapor deposition or atomic layer deposition.

12. The method of claim 10, further comprising disposing a plurality of optical couplers such that each of the plurality of optical couplers is associated with at least one nanowire.

13. The method of claim 12, wherein the plurality of optical couplers are configured to guide radiation into the nanowires.

14. The method of claim 1, wherein the nanowires comprise one or more of silicon (Si), germanium (Ge), boron phosphide (BP), boron arsenide (BAs), aluminum phosphide (AlP), aluminum arsenide (AlAs), aluminum antimonide (AlSb), gallium nitride (GaN), gallium phosphide (GaP), gallium arsenide (GaAs), gallium antimonide (GaSb), indium nitride (InN), indium phosphide (InP), indium arsenide (InAs), zinc oxide (ZnO), zinc sulfide (ZnS), zinc selenide (ZnSe), zinc telluride (ZnTe), cadmium sulfide (CdS), cadmium selenide (CdSe), and cadmium telluride (CdTe).

* * * * *